United States Patent
Nishikawa et al.

(10) Patent No.: US 7,791,989 B2
(45) Date of Patent: Sep. 7, 2010

(54) ARITHMETIC PROCESSING CIRCUIT UNIT AND DISC DEVICE

(75) Inventors: Koji Nishikawa, Kyoto (JP); Makoto Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 468 days.

(21) Appl. No.: 11/914,465

(22) PCT Filed: May 16, 2006

(86) PCT No.: PCT/JP2006/309707

§ 371 (c)(1),
(2), (4) Date: Nov. 15, 2007

(87) PCT Pub. No.: WO2006/123635

PCT Pub. Date: Nov. 23, 2006

(65) Prior Publication Data

US 2009/0080309 A1    Mar. 26, 2009

(30) Foreign Application Priority Data

May 18, 2005    (JP) ............................... 2005-145829

(51) Int. Cl.
*G11B 7/00*    (2006.01)

(52) U.S. Cl. ................................. 369/44.41; 369/44.11
(58) Field of Classification Search ...................... None
See application file for complete search history.

(56) References Cited

U.S. PATENT DOCUMENTS

| 5,357,155 A | 10/1994 | Wile |
| 5,875,158 A * | 2/1999 | Schell ..................... 369/44.34 |
| 2003/0072227 A1 * | 4/2003 | Yamashita et al. ........ 369/44.36 |

FOREIGN PATENT DOCUMENTS

| JP | 05-325304 | 12/1993 |
| JP | 06-103389 | 4/1994 |
| JP | 2002-008232 | 1/2002 |
| JP | 2003-218727 | 7/2003 |

* cited by examiner

*Primary Examiner*—Paul Huber
(74) *Attorney, Agent, or Firm*—Fish & Richardson P.C.

(57) ABSTRACT

By inputting differential signals to transistors Tr21*a* to Tr21*d* and Tr22*a* to Tr21*d*, an addition operation is performed on the four differential signals, and a filter operation is performed by a capacitor C21 and resistors R21 and R22. An offset of a signal obtained as a result of an addition operation performed on the four differential signals is removed by transistors Tr1 and Tr2.

7 Claims, 9 Drawing Sheets

ARITHMETIC PROCESSING CIRCUIT UNIT AND DISC DEVICE

This application is a 371 of PCT/JP2006/309707, filed May 16, 2006.

TECHNICAL FIELD

The present invention relates to arithmetic processing circuit units that perform an addition or subtraction operation on signals inputted in the form of analog signals. More particularly, the present invention relates to an arithmetic processing circuit unit for performing servo processing in a disc device.

BACKGROUND ART

Conventionally, in disc devices that play back data from or record data to disc storage media, such as optical discs and magneto-optical discs, into which various information such as video information, audio information, and computer data is written in the form of an radio-frequency signal, a servo control is performed for keeping an optical pickup in a desired position. Some examples of such servo control are a tracking control for moving the optical pickup along a track of a disc storage medium, and a focusing control for setting the focus of a laser beam emitted from the optical pickup toward the disc storage medium.

To perform the tracking control and focusing control described above, the disc device is provided with an arithmetic processing circuit unit that generates a tracking error signal and a focusing error signal based on the laser beam received by the optical pickup. Such a disc device is offered that is provided with an arithmetic processing circuit unit that can generate different tracking error signals according to a 3-beam method and a phase difference detection method (see Patent Document 1).

Figure 10:
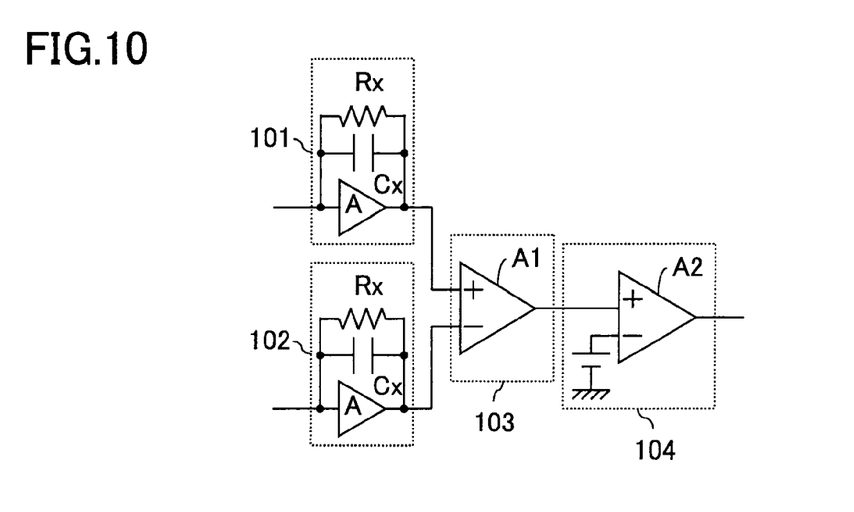
FIG. 10 A diagram showing the configuration of a conventional arithmetic processing circuit unit of a disc device.

In a conventional arithmetic processing circuit unit of a disc device, a circuit for a subtraction operation, for example, is configured as shown in FIG. 10. This configuration includes filter circuits 101 and 102 provided one for each of two input signals for permitting a signal at a predetermined frequency to pass therethrough, a subtraction circuit 103 performing a subtraction operation on the two signals that have passed through the filter circuits 101 and 102, and an offset adjustment circuit 104 removing an offset from the signal obtained as a result of the subtraction performed by the subtraction circuit 103.

In this case, the filter circuits 101 and 102 are each built with an amplifier A, and a capacitor Cx and a resistor Rx, each being connected at both ends thereof to the input and output of the amplifier A. The subtraction circuit 103 is built with an operational amplifier A1 having a non-inverting input terminal and an inverting input terminal connected to the outputs of the filter circuits 101 and 102. The offset adjustment circuit 104 is built with an operational amplifier A2 having a non-inverting input terminal connected to the output of the subtraction circuit 103 and an inverting input terminal to which an offset voltage is inputted.

Patent Document 1: JP-A-2002-008232

DISCLOSURE OF THE INVENTION

Problems to be Solved by the Invention

As shown in FIG. 10, the conventional arithmetic processing circuit unit used in the disc device requires different operational circuits for, in addition to an arithmetic operation, a filter operation and an offset adjustment operation. This increases the size of the circuitry for a single arithmetic operation, and hence electric power consumption. Moreover, an arithmetic processing circuit unit for performing a plurality of servo controls, such as a tracking control and a focusing control, requires different operational circuits for these servo controls, in addition to the above-described filter circuit and offset adjustment circuit for performing an arithmetic operation. This further increases the size of the circuitry, and hence electric power consumption.

In view of the conventionally experienced problems described above, it is an object of the present invention to provide arithmetic processing circuit units that can reduce the circuitry size and electric power consumption by using a differential signal.

Means for Solving the Problem

To achieve the above object, according to one aspect of the present invention, an arithmetic processing circuit unit receiving a plurality of signals and performing an addition/subtraction operation on the plurality of signals is provided with: differential signal generating circuits converting the plurality of signals into a plurality of differential signals; and an operational circuit. The operational circuit includes: a plurality of first transistors each receiving at a control electrode thereof a corresponding one of positive signals of the plurality of differential signals from the differential signal generating circuits; a plurality of second transistors each receiving at a control electrode thereof a corresponding one of negative signals of the plurality of differential signals, the plurality of second transistors being arranged in parallel with the plurality of first transistors; and a filter circuit connected between the first and second transistors to which a positive signal and a negative signal of one differential signal are respectively inputted. When a subtraction operation is performed on two signals, a first electrode of the first transistor receiving one of the two signals is connected to a first electrode of the second transistor receiving the other of the two signals, and a first electrode of the second transistor receiving the one of the two signals is connected to a first electrode of the first transistor receiving the other of the two signals. When an addition operation is performed on two signals, a first electrode of the first transistor receiving one of the two signals is connected to a first electrode of the first transistor receiving the other of the two signals, and a first electrode of the second transistor receiving the one of the two signals is connected to a first electrode of the second transistor receiving the other of the two signals.

According to another aspect of the present invention, a disc device that plays back data from or records data to a disc storage medium in which data is stored is provided with: an optical pickup emitting a laser beam to the disc storage medium and detecting light reflected from the disc storage medium; a servo device setting a position of the optical pickup; and a servo controller controlling operation of the servo device. The disc device includes, as the servo controller, one of the arithmetic processing circuit units described above.

Effect of the Invention

According to the present invention, an arithmetic operation is performed by a transistor to which a positive signal of a differential signal is inputted and a transistor to which a negative signal of the differential signal is inputted, the transistors being arranged in parallel to each other. As a result, unlike the conventional configuration, there is no need to provide a plurality of operational amplifiers each being composed of a plurality of transistors. This makes it possible to reduce the circuitry size and electric power consumption. In addition, by using a filter circuit in combination with an operational circuit built with transistors, it is possible to provide the operational circuit with filter characteristics for selecting a signal at a predetermined frequency. As a result, unlike the conventional configuration, there is no need to form an operational circuit and a filter circuit separately. Furthermore, by using additional two transistors, it is possible to perform offset adjustment. Thus, unlike the conventional configuration, there is no need to form an additional circuit with operational amplifiers for performing offset adjustment.

LIST OF REFERENCE SYMBOLS

1 Optical disc
2 Optical pickup
3 Spindle motor
4 Tracking actuator
5 Focus actuator
6 Sled motor
7 RF processor
8 AD converter
9 Driver
10 Decoder
11 Controller
12 Objective lens

BEST MODE FOR CARRYING OUT THE INVENTION

Figure 1:
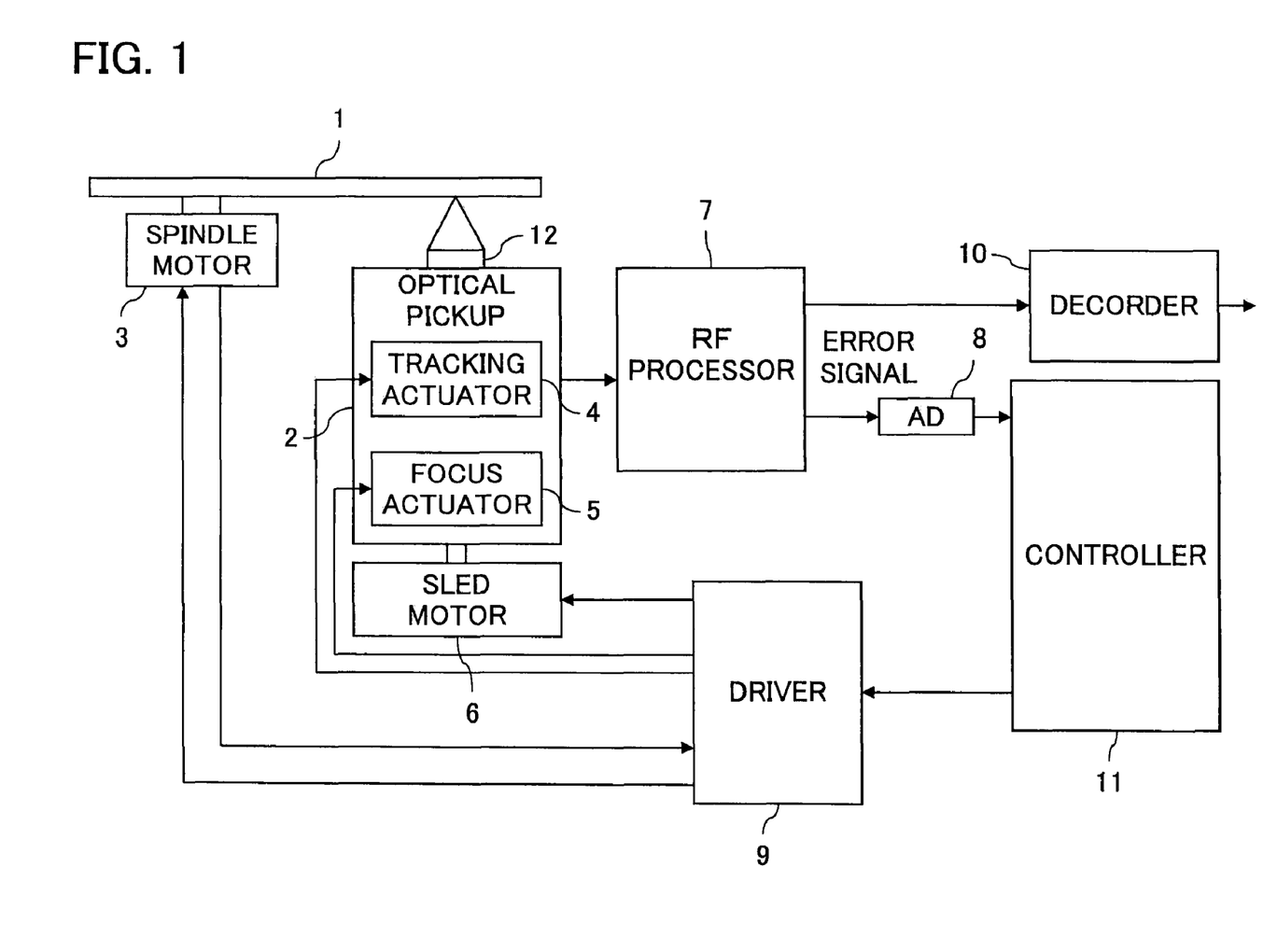
FIG. 1 A block diagram showing the internal configuration of an optical disc device.

An embodiment of the present invention will be described with reference to the accompanying drawings. FIG. 1 is a block diagram showing the internal configuration of an optical disc device. Although the embodiment under discussion deals with an optical disc device that reads data from an optical disc for playing it back, the invention is applicable also to, for example, an optical disc device that writes data into an optical disc for recording it thereon, or an optical disc device that can both record and play back an optical disc.

The optical disc device shown in FIG. 1 includes an optical pickup 2 that irradiates an optical disc 1 with a laser beam, a spindle motor 3 that spins the optical disc 1, a sled motor 6 that moves the optical pickup 2 in the direction of the radius of the optical disc 1 by means of an unillustrated arm portion, an RF processor 7 that processes a signal obtained as a result of the optical pickup 2 receiving light reflected from the disc 1, an AD converter 8 that converts a tracking error signal or a focus error signal obtained by the RF processor 7 into a digital signal, a driver 9 that drives the spindle motor 3 and the sled motor 6, a decoder 10 that generates data based on the RF signal fed from the RF processor 7, and a controller 11 that operates and controls the driver 9 and the optical pickup 2 based on the tracking error signal or the focus error signal fed from the AD converter 8.

The optical pickup 2 structured as described above includes an objective lens 12 that focuses a laser beam onto a track of the optical disc 1, a tracking actuator 4 that moves the objective lens 12 in the direction of the radius of the optical disc 1 so that the laser beam is shone onto the center of the track, and a focus actuator 5 that moves the objective lens 12 in the vertical direction with respect to the optical disc 1 so that an area of an appropriate size is irradiated with the laser beam. The tracking actuator 4 and the focus actuator 5 also are driven by the driver 9.

In this optical disc device, the driver 9 rotates and controls the spindle motor 3 to spin the optical disc 1 for continuously playing back the optical disc 1. In addition, a tracking servo control is performed for the optical pickup 2, so that the laser beam from the optical pickup 2 is made to follow a spiral recording track formed on the optical disc 1. That is, the driver 9 drives and controls the tracking actuator 4 in such a way that the objective lens 12 is shifted in the direction of the radius of the optical disc 1.

Specifically, the tracking error signal obtained by the RF processor 7 is converted into a digital signal by the AD converter 8, and the digital signal thus obtained is fed to the driver 9 via the controller 11. In the driver 9, a signal for moving the objective lens in the direction of the radius of the optical disc 1 is generated based on the tracking error signal. The tracking actuator 4 is driven and controlled according to the signal for moving the objective lens in the radial direction, such that the objective lens 12 is shifted in the direction of the radius of the disc 1. When the amount of shifting of the objective lens 12 reaches a predetermined level in the middle of performing the above-described tracking servo control, the driver 9 generates a signal for driving the sled motor. That is, because of cogging of the sled motor 6, when the amount of shifting of the objective lens 12 reaches a predetermined level, the sled motor 6 is driven in such a way as to move the optical pickup 2 in the direction of the radius of the disc 1.

When the disc is being played back, the optical disc 1 is spun and held by the spindle motor 3 in such a way as to keep a given distance from the optical pickup 2, and the position of the optical pickup 2 is so set that the laser beam from the optical pickup 2 is focused onto the signal surface of the optical disc 1. However, warpage of the optical disc 1 or the inclination of the axis of the spindle motor 3, for example, develops a wobble in the optical disc 1. To make the laser beam from the optical pickup 2 follow while focusing onto the signal surface of such an optical disc 1, a focus servo control is performed for the optical pickup 2. That is, the driver 9 drives and controls the focus actuator 5, such that the objective lens 12 is moved in the vertical direction with respect to the optical disc 1.

Specifically, the focus error signal obtained by the RF processor 7 is converted into a digital signal by the AD converter 8, and the digital signal thus obtained is fed to the driver 9 via the controller 11. In the driver 9, a signal for moving the objective lens in the vertical direction with respect to the optical disc 1 is generated based on the focus error signal. The focus actuator 5 is driven and controlled according to the signal for moving the objective lens in the vertical direction, such that the objective lens 12 is shifted up and down in the vertical direction with respect to the optical disc 1.

Figure 2:
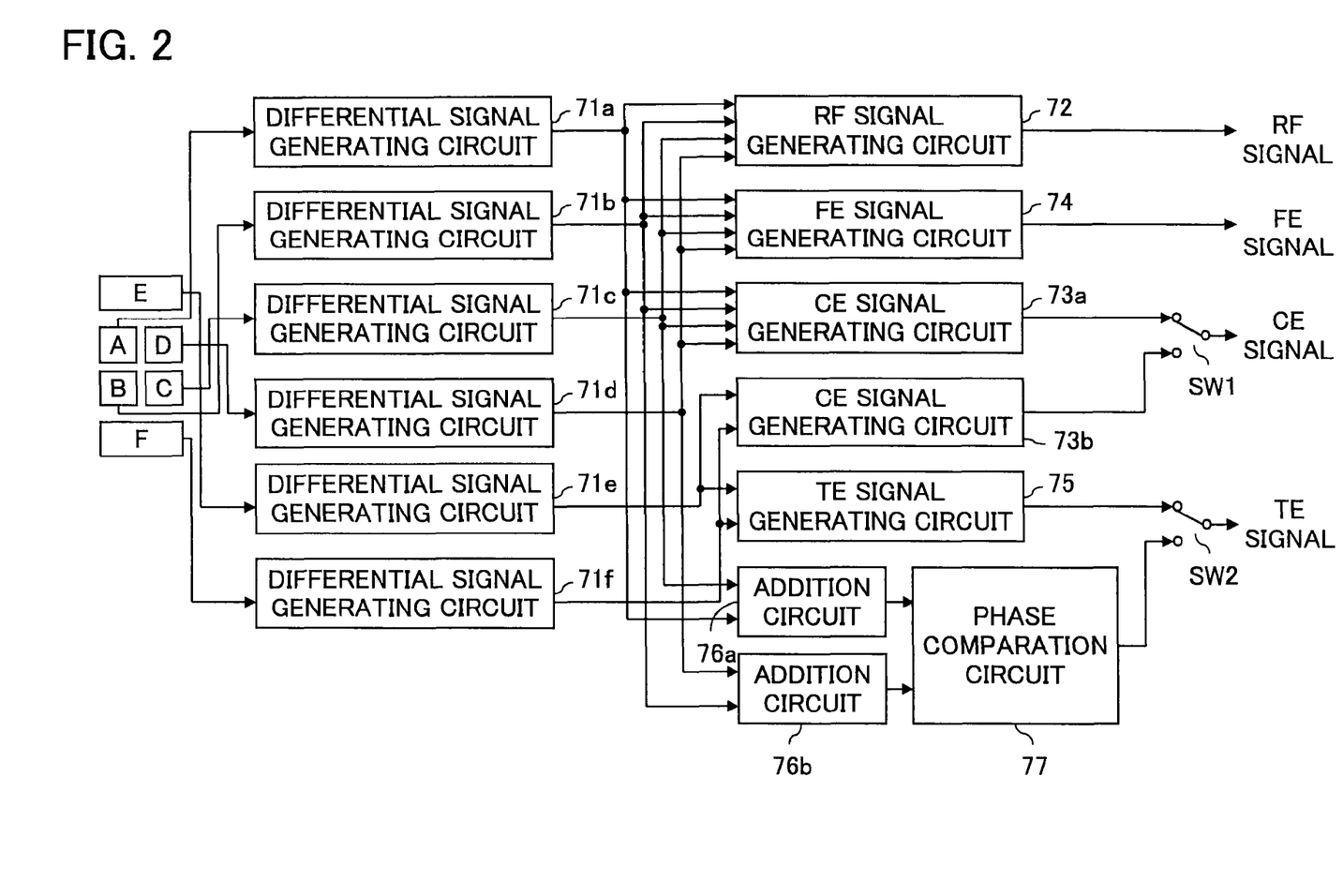
FIG. 2 A block diagram showing the internal configuration of the RF processor of the optical disc device shown in FIG. 1.

The RF processor 7 in the optical disc device operating as described above is configured as shown in FIG. 2. FIG. 2 shows the internal configuration of the RF processor 7 and the relationship with light receiving sensors provided in the optical pickup device 2. Emitted from the optical pickup device 2 are a main beam shone onto a target track of the optical disc 1 and two sub-beams shone onto the tracks located on both sides of the target track of the optical disc 1.

The main beam reflected from the optical disc 1 enters four light receiving sensors A to D of the optical pickup 2, and the two sub-beams reflected from the optical disc 1 each enter a corresponding one of light receiving sensors E and F of the optical pickup 2. Here, the light receiving sensors A to D are so arranged that the light receiving sensors A and C are disposed so as to be diagonally opposite to each other and that the light receiving sensors B and D are disposed so as to be diagonally opposite to each other. The electric signals obtained as a result of the light reflected from the optical disc 1 entering the light receiving sensors A to F are fed to the RF processor 7. Based on the electric signals thus obtained, the tracking error signal, the focusing error signal, and the RF signal are generated.

The RF processor 7 includes differential signal generating circuits 71a to 71f that convert the signals from the light receiving sensors A to F, respectively, into differential signals, an RF signal generating circuit 72 that generates an RF signal by performing an addition operation on the signals from the differential signal generating circuits 71a to 1d, a center error signal generating circuit 73a that generates, based on a signal obtained by subtracting the sum of the signals from the differential signal generating circuits 71b and 71c from the sum of the signals from the differential signal generating circuits 71a and 71d, a center error signal for checking for a deviation from the center of the track, a center error signal generating circuit 73b that generates a center error signal by performing a subtraction operation on the signal from the differential signal generating circuit 71e and the signal from the differential signal generating circuit 71f, a switch SW1 that selectively outputs one of the center error signals from the center error signal generating circuits 73a and 73b, a focusing error signal generating circuit 74 that generates a focusing error signal based on a signal obtained by subtracting the sum of the signals from the differential signal generating circuits 71b and 71d from the sum of the signals from the differential signal generating circuits 71a and 71c, a tracking error signal generating circuit 75 that generates a tracking error signal by performing a subtraction operation on the signal from the differential signal generating circuit 71f and the signal from the differential signal generating circuit 71e, an addition circuit 76a that performs an addition operation on the signals from the differential signal generating circuits 71a and 71c, an addition circuit 76b that performs an addition operation on the signals from the differential signal generating circuits 71b and 71d, a phase comparison circuit 77 that generates a tracking error signal by comparing phase differences of the signals from the addition circuits 76a and 76b, and a switch SW2 that selectively outputs one of the tracking error signals from the tracking error signal generating circuit 75 and the phase comparison circuit 77.

Figure 3:
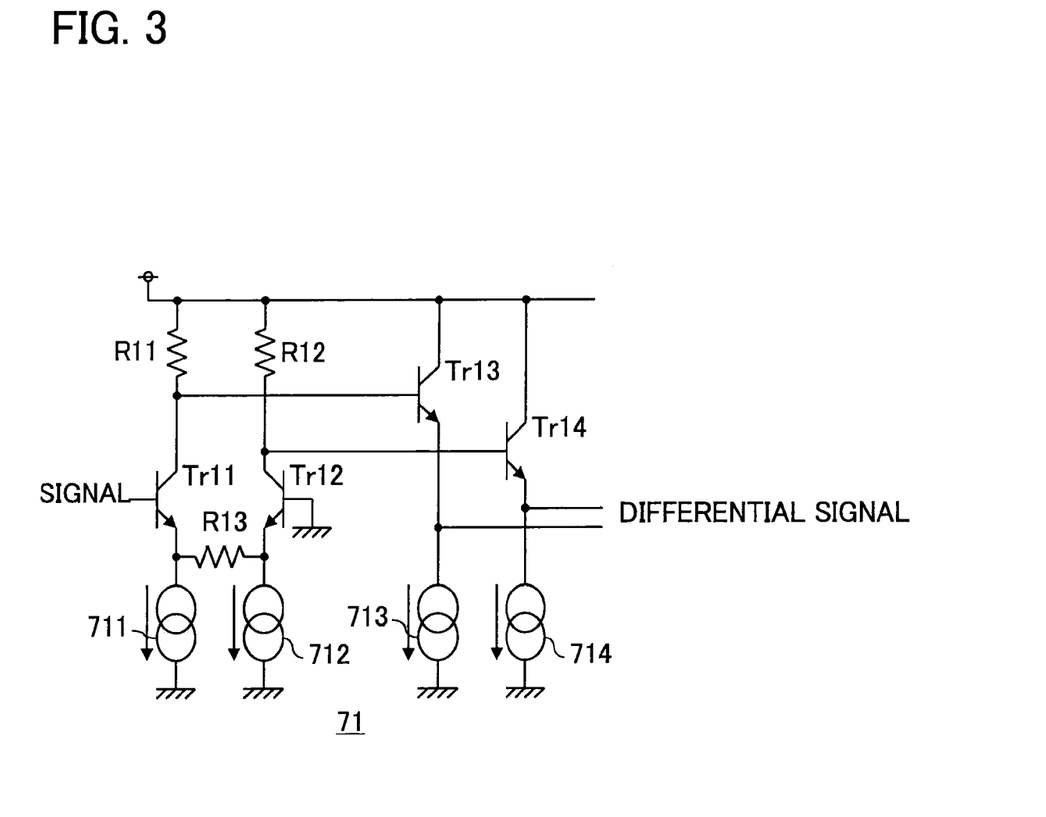
FIG. 3 A circuit diagram showing the configuration of the differential signal generating circuit.

In the RF processor 7 configured as described above, the differential signal generating circuits 71a to 71f have the same configuration, which is shown in FIG. 3. FIG. 3 shows the circuit configuration of a differential signal generating circuit 71 corresponding to each of the differential signal generating circuits 71a to 71f.

The differential signal generating circuit 71 shown in FIG. 3 includes a differential amplification stage composed of an npn transistor Tr11 that receives at the base thereof a signal from one of the light receiving sensors A to F, an npn transistor Tr12 having a base connected to the ground, resistors R11 and R12 each having one end connected to a corresponding one of the collectors of the transistors Tr11 and Tr12 and the other end connected to the power supply voltage, constant current sources 711 and 712 each having one end connected to a corresponding one of the emitters of the transistors Tr11 and Tr12 and the other end connected to the ground, and a resistor R13 connected between the emitters of the transistors Tr11 and Tr12.

The differential signal generating circuit 71 further includes a buffer stage composed of npn transistors Tr13 and Tr14 each having the base connected to a corresponding one of the collectors of the transistors Tr11 and Tr12 provided in the differential amplification stage and the collector to which the power supply voltage is applied, and constant current sources 713 and 714 each having one end connected to a corresponding one of the emitters of the transistors Tr13 and Tr14 and the other end connected to the ground. In this buffer stage, outputted from the emitter of the transistor Tr13 is the signal obtained by inverting the phase of the signal inputted to the transistor Tr11; outputted from the emitter of the transistor Tr14 is the signal having the same phase as the signal inputted to the transistor Tr11. In this way, from each of the differential signal generating circuits 71a to 71f, a differential signal of the signal inputted thereto from a corresponding one of the light receiving sensors A to F is outputted.

Figure 4:
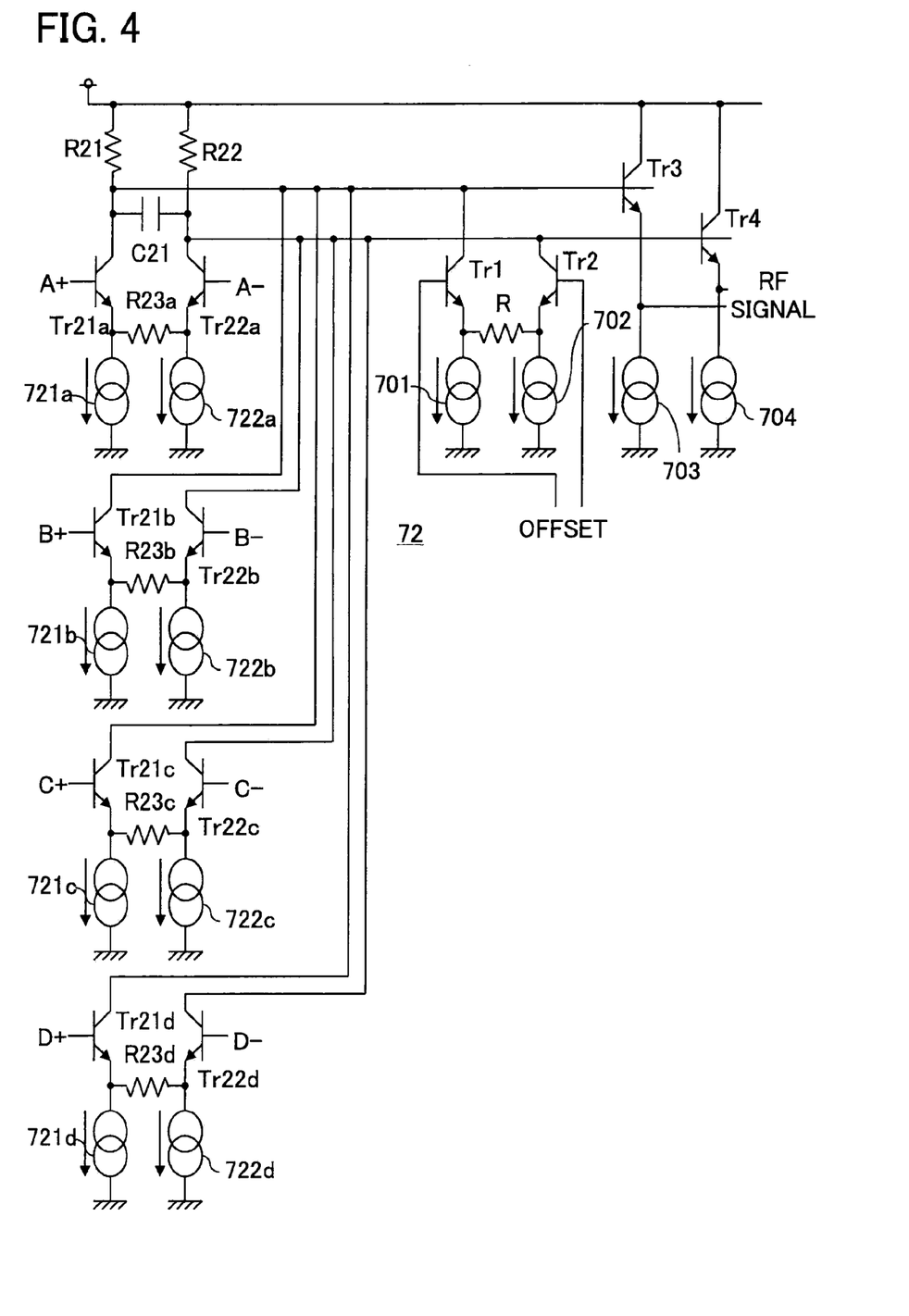
FIG. 4 A circuit diagram showing the configuration of the RF signal generating circuit.

Used as the RF signal generating circuit 72 is, for example, an arithmetic processing circuit unit shown in FIG. 4. The arithmetic processing circuit unit shown in FIG. 4 includes an addition operation stage that performs an addition operation on the signals from the light receiving sensors A to D, the addition operation stage being composed of transistors Tr21a and Tr22a that receive at the bases thereof a positive signal A+ and a negative signal A−, respectively, of the differential signal from the differential signal generating circuit 71a, transistors Tr21b and Tr22b that receive at the bases thereof a positive signal B+ and a negative signal B−, respectively, of the differential signal from the differential signal generating circuit 71b, transistors Tr21c and Tr22c that receive at the bases thereof a positive signal C+ and a negative signal C−, respectively, of the differential signal from the differential signal generating circuit 71c, transistors Tr21d and Tr22d that receive at the bases thereof a positive signal D+ and a negative signal D−, respectively, of the differential signal from the differential signal generating circuit 71d, resistors R21 and R22 each having one end connected to a corresponding one of the collectors of the transistors Tr21a and Tr22a and the other end to which the power supply voltage is applied, a capacitor C21 connected between the collectors of the transistors Tr21a and Tr22a, a resistor R23a connected between the emitters of the transistors Tr21a and Tr22a, a resistor R23b connected between the emitters of the transistors Tr21b and Tr22b, a resistor R23c connected between the emitters of the transistors Tr21c and Tr22c, a resistor R23d connected between the emitters of the transistors Tr21d and Tr22d, constant current sources 721a to 721d each having one end connected to a corresponding one of the emitters of the transistors Tr21a to Tr21d and the other end connected to the ground, and constant current sources 722a to 722d each having one end connected to a corresponding one of the emitters of the transistors Tr22a to Tr22d and the other end connected to the ground.

In this addition operation stage, the collectors of the transistors Tr21a to Tr21d are connected to each other, and the collectors of the transistors Tr22a to Tr22d are connected to each other. That is, the currents passing through the transistors Tr21a to Tr21d pass through the resistor R21, and the currents passing through the transistors Tr22a to Tr22d pass through the resistor R22. As a result, the currents passing through the transistors Tr21a to Tr21d are based on the positive signals A+ to D+, and the currents passing through the transistors Tr22a to Tr22d are based on the negative signals A– to D–.

Therefore, the sum of the currents based on the positive signals A+ to D+ passes through the resistor R21; the sum of the currents based on the negative signals A– to D– passes through the resistor R22. That is, the addition operation stage generates a signal obtained as a result of an addition operation performed on the differential signals of the signals inputted from the light receiving sensors A to D. In addition, the resistors R21 and R22 and the capacitor C21 form a filter that permits signals of the signals A+ to D+ and A– to D–, the signals at a predetermined frequency, to pass therethrough.

This causes a voltage drop corresponding to the sum of the positive signals A+ to D+ to occur across the resistor R21, and a voltage corresponding to the sum of the positive signals A+ to D+ appears at a node at which the collectors of the transistors Tr21a to Tr21d are connected together. Likewise, a voltage drop corresponding to the sum of the negative signals A– to D– occurs across the resistor R22, and a voltage corresponding to the sum of the negative signals A– to D– appears at a node at which the collectors of the transistors Tr22a to Tr22d are connected together.

Furthermore, an npn transistor Tr1 connected at the collector thereof to the node at which the collectors of the transistors Tr21a to Tr21d are connected together, an npn transistor Tr2 connected at the collector thereof to the node at which the collectors of the transistors Tr22a to Tr22d are connected together, a resistor R connected between the emitters of the transistors Tr1 and Tr2, a constant current source 701 having one end connected to the emitter of the transistor Tr1 and the other end connected to the ground, and a constant current source 702 having one end connected to the emitter of the transistor Tr2 and the other end connected to the ground together form an offset adjustment stage.

The amount of offset is determined by a difference between voltages to be fed to the bases of the transistors Tr1 and Tr2. The current passing through the transistor Tr1 passes through the resistor R21, and the current passing through the transistor Tr2 passes through the resistor R22. An offset of a voltage obtained as a result of an addition operation performed on the positive signals A+ to D+, the voltage appearing at the node at which the collectors of the transistors Tr21a to Tr21d are connected together, is adjusted by a difference between the currents passing through the transistors Tr1 and Tr2. Likewise, an offset of a voltage obtained as a result of an addition operation performed on the negative signals A– to D–, the voltage appearing at the node at which the collectors of the transistors Tr22a to Tr22d are connected together, is adjusted by a difference between the currents passing through the transistors Tr1 and Tr2.

Moreover, there is provided a buffer stage composed of npn transistors Tr3 and Tr4 each having the base connected to a corresponding one of the collectors of the transistors Tr1 and Tr2 and the collector to which the power supply voltage is applied, and constant current sources 703 and 704 each having one end connected to a corresponding one of the emitters of the transistors Tr3 and Tr4 and the other end connected to the ground. With this configuration, the voltage obtained as a result of an addition operation performed on the positive signals A+ to D+, the voltage to which offset adjustment is performed by the offset adjustment stage, is fed to the base of the transistor Tr3, whereby a positive signal of an RF signal is outputted from the emitter of the transistor Tr3. Likewise, the voltage obtained as a result of an addition operation performed on the negative signals A– to D–, the voltage to which offset adjustment is performed by the offset adjustment stage, is fed to the base of the transistor Tr4, whereby a negative signal of the RF signal is outputted from the emitter of the transistor Tr4.

Figure 5:
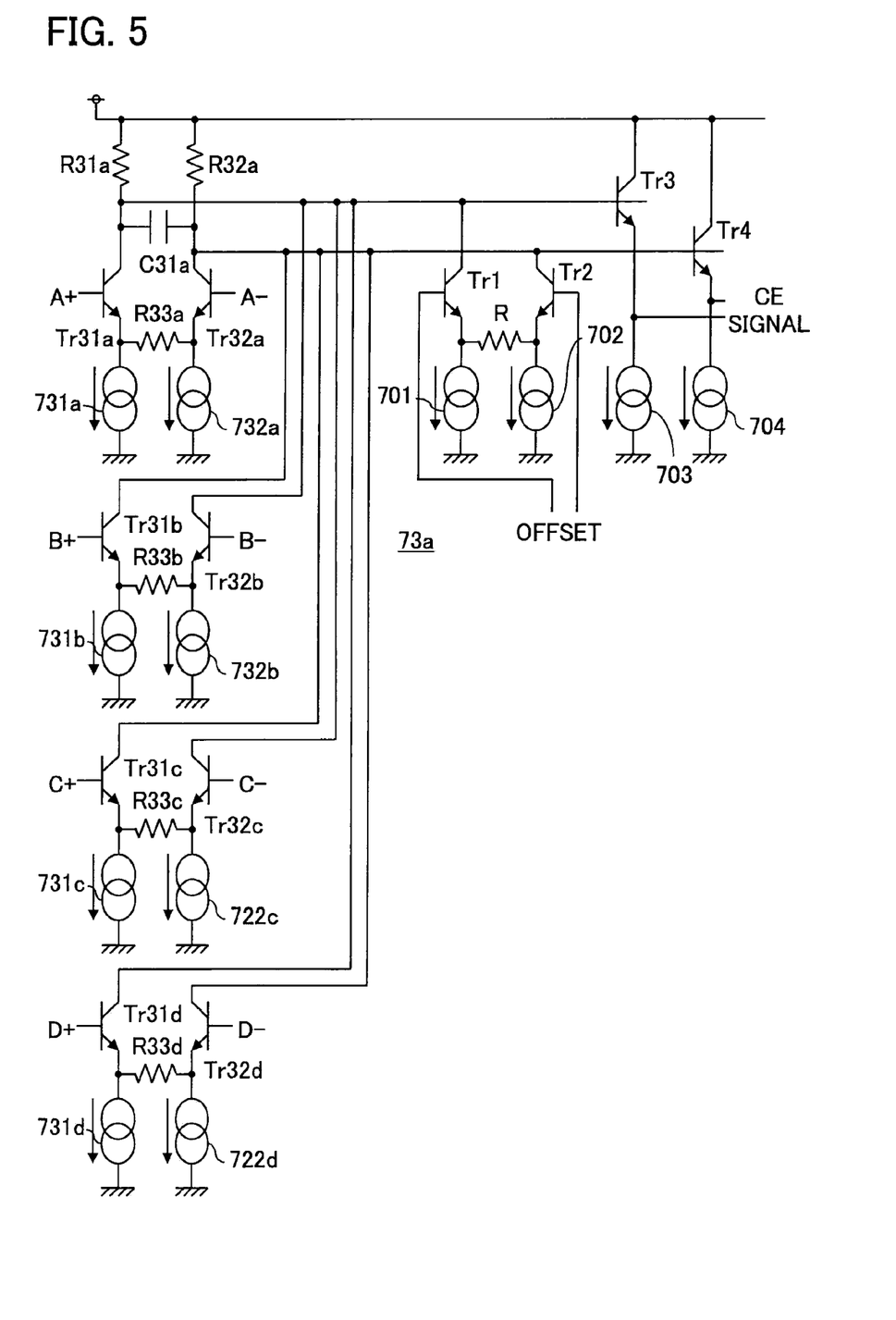
FIG. 5 A circuit diagram showing the configuration of the center error signal generating circuit.

Used as the center error signal generating circuit 73a is, for example, an arithmetic processing circuit unit shown in FIG. 5. As is the case with the arithmetic processing circuit unit shown in FIG. 4, the arithmetic processing circuit unit shown in FIG. 5 also includes the offset adjustment stage composed of the transistors Tr1 and Tr2, the resistor R, and the constant current sources 701 and 702, and the buffer stage composed of the transistors Tr3 and Tr4 and the constant current sources 703 and 704.

An addition/subtraction operation stage that performs an addition/subtraction operation on the signals from the light receiving sensors A to D is composed of transistors Tr31a to Tr31d that receive at the bases thereof positive signals A+ to D+, respectively, of the differential signals from the differential signal generating circuits 71a to 71d, transistors Tr32a to Tr32d that receive at the bases thereof negative signals A– to D–, respectively, of the differential signals from the differential signal generating circuits 71a to 71d, resistors R31a and R32a each having one end connected to a corresponding one of the collectors of the transistors Tr31a and Tr32a and the other end to which the power supply voltage is applied, a capacitor C31a connected between the collectors of the transistors Tr31a and Tr32a, a resistor R33a connected between the emitters of the transistors Tr31a and Tr32a, a resistor R33b connected between the emitters of the transistors Tr31b and Tr32b, a resistor R33c connected between the emitters of the transistors Tr31c and Tr32c, a resistor R33d connected between the emitters of the transistors Tr31d and Tr32d, constant current sources 731a to 731d each having one end connected to a corresponding one of the emitters of the transistors Tr31a to Tr31d and the other end connected to the ground, and constant current sources 732a to 732d each having one end connected to a corresponding one of the emitters of the transistors Tr32a to Tr32d and the other end connected to the ground.

In this addition/subtraction operation stage, the collectors of the transistors Tr31a, Tr32b, Tr32c, and Tr31d are connected together, and the collectors of the transistors Tr32a, Tr31b, Tr31c, and Tr32d are connected together. The collector of the transistor Tr1 and the base of the transistor Tr3 are connected to the node at which the collectors of the transistors Tr31a, Tr32b, Tr32c, and Tr31d are connected together, and the collector of the transistor Tr2 and the base of the transistor Tr4 are connected to the node at which the collectors of the transistors Tr32a, Tr31b, Tr31c, and Tr32d are connected together.

With this configuration, the sum of the currents based on the positive signals A+ and D+ and the negative signals B– and C– passes through the resistor R31a; the sum of the currents based on the negative signals A– and D– and the positive signals B+ and C+ passes through the resistor R32a. That is, the addition/subtraction operation stage generates a signal obtained by subtracting a signal obtained as a result of an addition operation performed on the differential signals inputted from the light receiving sensors B and C from a signal obtained as a result of an addition operation performed on the differential signals inputted from the light receiving sensors A and D. In addition, the resistors R31a and R32a and the capacitor C31a form a filter that permits signals of the signals A+ to D+ and A− to D−, the signals at a predetermined frequency, to pass therethrough.

Figure 6:
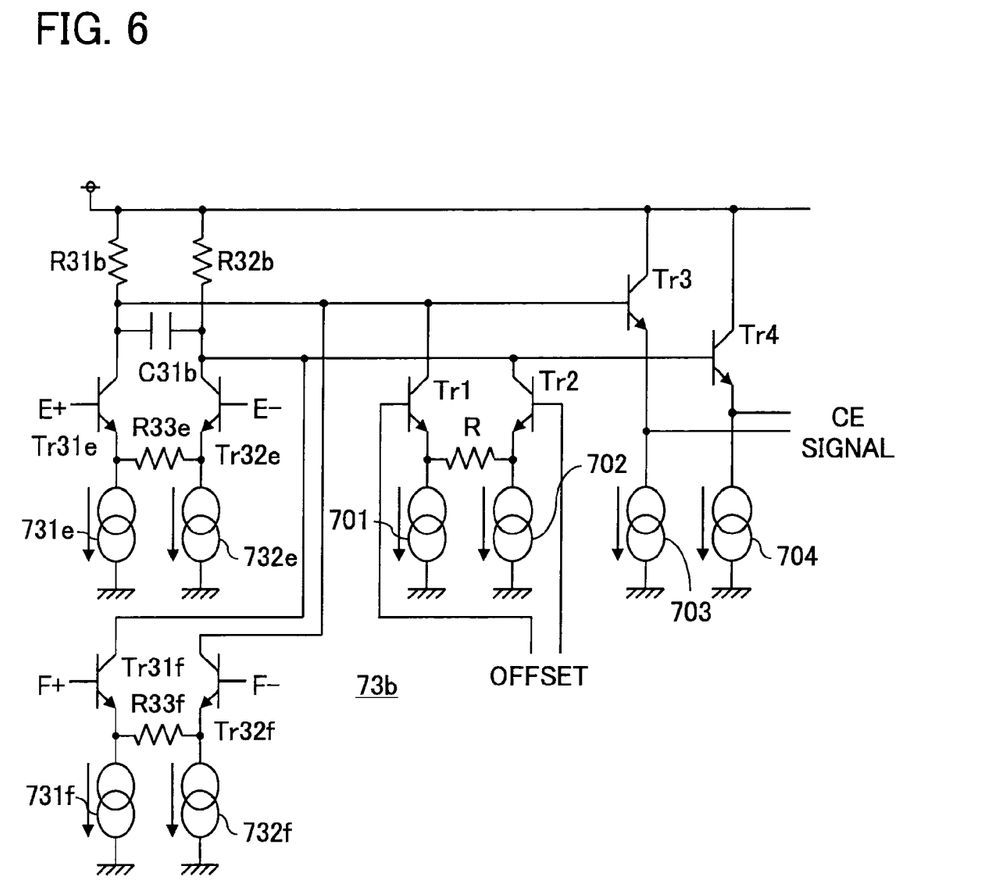
FIG. 6 A circuit diagram showing the configuration of the center error signal generating circuit.

Used as the center error signal generating circuit 73b is, for example, an arithmetic processing circuit unit shown in FIG. 6. The arithmetic processing circuit unit shown in FIG. 6 also includes the offset adjustment stage and the buffer stage shown in FIGS. 4 and 5.

A subtraction operation stage that performs a subtraction operation on the signals from the light receiving sensors E and F is composed of transistors Tr31e and Tr31f that receive at the bases thereof positive signals E+ and F+, respectively, of the differential signals from the differential signal generating circuits 71e and 71f, transistors Tr32e and Tr32f that receive at the bases thereof negative signals E− and F−, respectively, of the differential signals from the differential signal generating circuits 71e and 71f, resistors R31b and R32b each having one end connected to a corresponding one of the collectors of the transistors Tr31e and Tr32e and the other end to which the power supply voltage is applied, a capacitor C31b connected between the collectors of the transistors Tr31e and Tr32e, a resistor R33e connected between the emitters of the transistors Tr31e and Tr32e, a resistor R33f connected between the emitters of the transistors Tr31f and Tr32f, and constant current sources 731e, 731f, 732e, and 732f each having one end connected to a corresponding one of the emitters of the transistor Tr31e, Tr31f, Tr32e, and Tr32f and the other end connected to the ground.

In this subtraction operation stage, the collectors of the transistors Tr31e and Tr32f are connected together, and the collectors of the transistors Tr32e and Tr31f are connected together. The collector of the transistor Tr1 and the base of the transistor Tr3 are connected to the node at which the collectors of the transistors Tr31e and Tr32f are connected together, and the collector of the transistor Tr2 and the base of the transistor Tr4 are connected to the node at which the collectors of the transistors Tr32e and Tr31f are connected together.

With this configuration, the sum of the currents based on the positive signal E+ and the negative signal F− passes through the resistor R31b; the sum of the currents based on the negative signal E− and the positive signal F+ passes through the resistor R32b. That is, the subtraction operation stage generates a signal obtained by subtracting a differential signal of the signal inputted from the light receiving sensor F from a differential signal of the signal inputted from the light receiving sensor E. In addition, the resistors R31b and R32b and the capacitor C31b form a filter that permits signals of the signals E+, F+, E−, and F−, the signals at a predetermined frequency, to pass therethrough.

Figure 7:
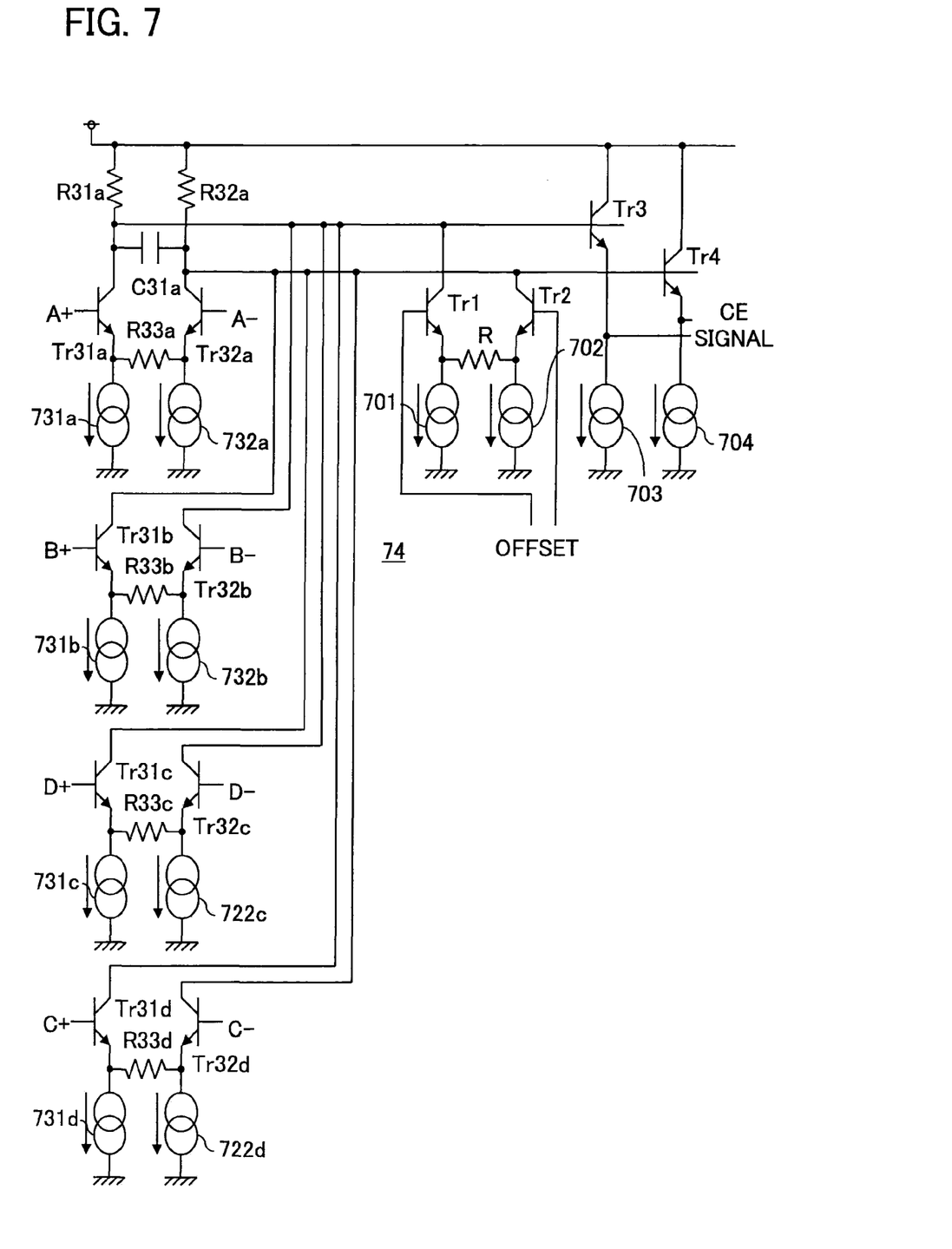
FIG. 7 A circuit diagram showing the configuration of the focusing error signal generating circuit.

Used as the focusing error signal generating circuit 74 is, for example, an arithmetic processing circuit unit shown in FIG. 7. The arithmetic processing circuit unit shown in FIG. 7 also includes the offset adjustment stage and the buffer stage shown in FIGS. 4 to 6. The arithmetic processing circuit unit shown in FIG. 7 includes an addition/subtraction operation stage having a configuration similar to that of the arithmetic processing circuit unit shown in FIG. 5.

That is, there is provided an addition/subtraction operation stage composed of the transistors Tr31a to Tr31d and Tr32a to Tr32d, the resistors R31a, R32a, and R33a to R33d, the capacitor 31a, and the constant current sources 731a to 731d and 732a to 732d, which are connected in the same manner as those of the arithmetic processing circuit unit shown in FIG. 5. A positive signal D+ and a negative signal D− of the differential signal from the differential signal generating circuit 71d are inputted to the bases of the transistors Tr31c and Tr32c, respectively, and a positive signal C+ and a negative signal C− of the differential signal from the differential signal generating circuit 71c are inputted to the bases of the transistors Tr31d and Tr32d, respectively. In other respects, this addition/subtraction operation stage has a configuration similar to that of the arithmetic processing circuit unit shown in FIG. 5.

With this configuration, the sum of the currents based on the positive signals A+ and C+ and the negative signals B− and D− passes through the resistor R31a; the sum of the currents based on the negative signals A− and C− and the positive signals B+ and D+ passes through the resistor R32a. That is, the addition/subtraction operation stage generates a signal obtained by subtracting a signal obtained as a result of an addition operation performed on the differential signals inputted from the light receiving sensors B and D from a signal obtained as a result of an addition operation performed on the differential signals inputted from the light receiving sensors A and C.

Figure 8:
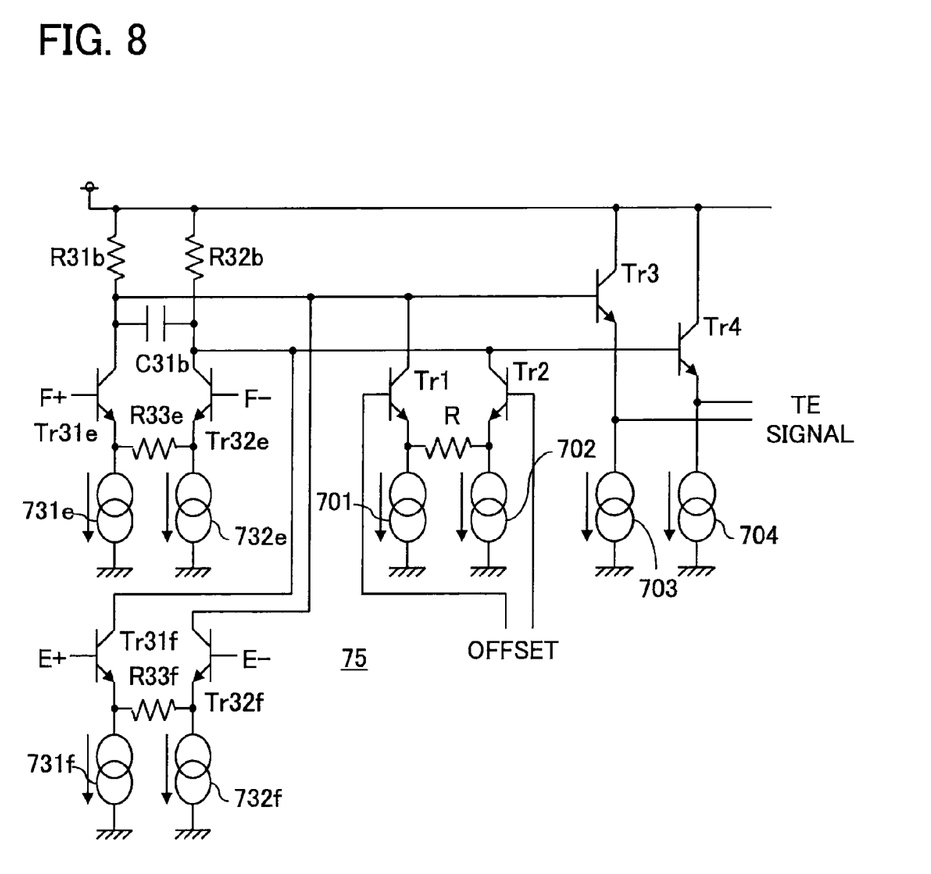
FIG. 8 A circuit diagram showing the configuration of the tracking error signal generating circuit.

Used as the tracking error signal generating circuit 75 is, for example, an arithmetic processing circuit unit shown in FIG. 8. The arithmetic processing circuit unit shown in FIG. 8 also includes the offset adjustment stage and the buffer stage shown in FIGS. 4 to 7. The arithmetic processing circuit unit shown in FIG. 8 includes a subtraction operation stage having a configuration similar to that of the arithmetic processing circuit unit shown in FIG. 6.

That is, there is provided a subtraction operation stage composed of the transistors Tr31e, Tr31f, Tr32e, and Tr32f, the resistors R31b, R32b, R33e, and R33f, the capacitor 31b, and the constant current sources 731e, 731f, 732e, and 732f, which are connected in the same manner as those of the arithmetic processing circuit unit shown in FIG. 6. A positive signal F+ and a negative signal F− of the differential signal from the differential signal generating circuit 71f are inputted to the bases of the transistors Tr31e and Tr32e, respectively, and a positive signal E+ and a negative signal E− of the differential signal from the differential signal generating circuit 71e are inputted to the bases of the transistors Tr31f and Tr32f, respectively. In other respects, this subtraction operation stage has a configuration similar to that of the arithmetic processing circuit unit shown in FIG. 6.

With this configuration, the sum of the currents based on the negative signal E− and the positive signal F+ passes through the resistor R31b; the sum of the currents based on the positive signal E+ and the negative signal F− passes through the resistor R32b. That is, the subtraction operation stage generates a signal obtained by subtracting a differential signal of the signal inputted from the light receiving sensor E from a differential signal of the signal inputted from the light receiving sensor F.

Figure 9:
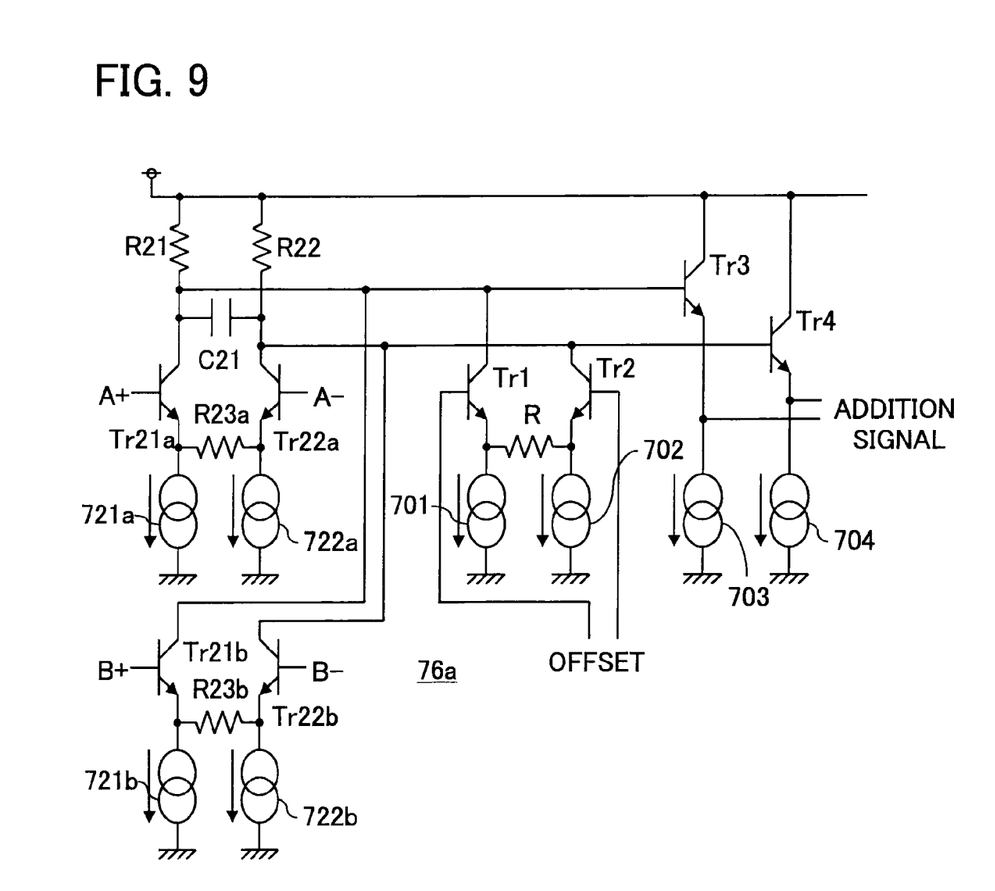
FIG. 9 A circuit diagram showing the configuration of the addition circuit.

Used as the addition circuits 76a and 76b is, for example, an arithmetic processing circuit unit shown in FIG. 9. The arithmetic processing circuit unit shown in FIG. 9 also includes the offset adjustment stage and the buffer stage shown in FIGS. 4 to 8. Although the arithmetic processing circuit unit shown in FIG. 9 represents the addition circuit 76a, the addition circuit 76b has a configuration similar to that of the arithmetic processing circuit unit shown in FIG. 9.

The addition operation stage in the arithmetic processing circuit unit shown in FIG. 9 is composed of the transistors Tr21a, Tr21b, Tr22a, and Tr22b, the resistors R21, R22, R23a, and R23b, the capacitor C21, and the constant current sources 721a, 721b, 722a, and 722b, which form part of the addition operation stage in the arithmetic processing circuit unit shown in FIG. 4. When operating as the addition circuit 76a, a positive signal A+ of the differential signal from the differential signal generating circuit 71a is inputted to the base of the transistor Tr21a and a positive signal B+ of the differential signal from the differential signal generating circuit 71b is inputted to the base of the transistor Tr21b; a positive signal A− of the differential signal from the differential signal generating circuit 71a is inputted to the base of the transistor Tr22a and a positive signal B− of the differential signal from the differential signal generating circuit 71b is inputted to the base of the transistor Tr22b. When operating as the addition circuit 76b, a positive signal C+ of the differential signal from the differential signal generating circuit 71c is inputted to the base of the transistor Tr21a and a positive signal D+ of the differential signal from the differential signal generating circuit 71d is inputted to the base of the transistor Tr21b; a positive signal C− of the differential signal from the differential signal generating circuit 71c is inputted to the base of the transistor Tr22a and a positive signal D− of the differential signal from the differential signal generating circuit 71d is inputted to the base of the transistor Tr22b.

INDUSTRIAL APPLICABILITY

The arithmetic processing circuit unit of the present invention can be applied to arithmetic processing circuit units performing an addition/subtraction operation on alternating-current analog signals. This arithmetic processing circuit unit can be applied to circuit devices generating signals for performing different servo controls in optical disc devices.

The invention claimed is:

1. An arithmetic processing circuit unit to receive a plurality of signals and performing an addition/subtraction operation on the plurality of signals, the arithmetic processing circuit unit comprising:
   differential signal generating circuits to convert the plurality of signals into a plurality of differential signals; and
   an operational circuit comprising:
      a plurality of first transistors each to receive at a respective control electrode thereof a corresponding one of positive signals of the plurality of differential signals from the differential signal generating circuits;
      a plurality of second transistors each to receive at a respective control electrode thereof a corresponding one of negative signals of the plurality of differential signals, the plurality of second transistors arranged in parallel with the plurality of first transistors; and
      a filter circuit connected between the first and second transistors to receive, respectively, a positive signal and a negative signal of one differential signal,
      wherein, the arithmetic processing circuit unit is configured so that, when a subtraction operation is performed on two signals, a first electrode of the first transistor receiving one of the two signals is connected to a first electrode of the second transistor receiving the other of the two signals, and a first electrode of the second transistor receiving the one of the two signals is connected to a first electrode of the first transistor receiving the other of the two signals, and
      wherein, the arithmetic processing circuit unit is configured so that, when an addition operation is performed on two signals, a first electrode of the first transistor receiving one of the two signals is connected to a first electrode of the first transistor receiving the other of the two signals, and a first electrode of the second transistor receiving the one of the two signals is connected to a first electrode of the second transistor receiving the other of the two signals.

2. The arithmetic processing circuit unit of claim 1, wherein the operational circuit comprises an offset adjustment stage,
   the offset adjustment stage comprising:
      a third transistor having a first electrode connected to a first electrode of the first transistor to receive a positive signal of one differential signal; and
      a fourth transistor having a first electrode connected to a first electrode of the second transistor to receive a negative signal of the one differential signal, and
   wherein the arithmetic processing circuit unit is configured so that an offset of a signal obtained by an arithmetic operation performed by the first and second transistors is removed by adjusting voltages to be fed to the control electrodes of the third and fourth transistors.

3. The arithmetic processing circuit unit of claim 2, wherein the offset adjustment stage comprises:
   two constant current sources each having one end connected to a second electrode of a corresponding one of the third and fourth transistors and the other end to receive a first direct-current voltage; and
   a resistor connected between the second electrodes of the third and fourth transistors.

4. The arithmetic processing circuit unit of claim 1, wherein the operational circuit comprises a buffer stage,
   the buffer stage comprising:
      a fifth transistor having a control electrode connected to a first electrode of the first transistor to receive a positive signal of one differential signal; and
      a sixth transistor having a control electrode connected to a first electrode of the second transistor to receive a negative signal of the one differential signal is,
   wherein the arithmetic processing circuit unit is configured so that signals obtained by an arithmetic operation performed by the first and second transistors are amplified and outputted by the fifth and sixth transistors, respectively.

5. The arithmetic processing circuit unit of claim 1, wherein the filter circuit comprises:
   a capacitor connected between a first electrode of the first transistor to receive a positive signal of one differential signal and a first electrode of the second transistor to receive a negative signal of the one differential signal;
   a first resistor having one end connected to one end of the capacitor and the other end to receive a second direct-current voltage; and
   a second resistor having one end connected to the other end of the capacitor and the other end to receive which the second direct-current voltage.

6. The arithmetic processing circuit unit of claim 1, wherein the operational circuit comprises:
   a plurality of constant current sources each having one end connected to a second electrode of a corresponding one of the plurality of first and second transistors and the other end to receive a first direct-current voltage; and
   a plurality of resistors provided one for each of the differential signals, the plurality of resistors each being connected between the second electrodes of the first and second transistors.

7. A disc device to play back data from or record data to a disc storage medium in which data is stored, the disc device comprising:
   an optical pickup to emit a laser beam to the disc storage medium and detect light reflected from the disc storage medium;
   a servo device to set a position of the optical pickup; and
   a servo controller to control operation of the servo device, wherein the servo controller comprises an arithmetic processing circuit unit according to any one of claims 1 to 6.

* * * * *